United States Patent
Tu et al.

(10) Patent No.: US 7,042,018 B2
(45) Date of Patent: May 9, 2006

(54) STRUCTURE OF GAN LIGHT-EMITTING DIODE

(75) Inventors: Ru-Chin Tu, Tainan (TW); Liang-Wen Wu, Banciao (TW); Cheng-Tsang Yu, Wufong Township, Taichung County (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 10/948,401

(22) Filed: Sep. 22, 2004

(65) Prior Publication Data

US 2006/0060873 A1    Mar. 23, 2006

(51) Int. Cl.
*H01L 33/00* (2006.01)
(52) U.S. Cl. .............. 257/97; 257/96; 257/15
(58) Field of Classification Search ............... 257/94, 257/96, 97, 15, 101, E33.033, E33.032, E33.03, 257/E33.028, E33.025, E33.034, E33.01; 372/44.01, 45.012

See application file for complete search history.

(56) References Cited

U.S. PATENT DOCUMENTS

| | | | | |
|---|---|---|---|---|
| 6,147,364 A | * | 11/2000 | Itaya et al. | 257/76 |
| 6,172,382 B1 | * | 1/2001 | Nagahama et al. | 257/94 |
| 6,515,306 B1 | * | 2/2003 | Kuo et al. | 257/82 |
| 6,847,046 B1 | * | 1/2005 | Wei et al. | 257/15 |

* cited by examiner

*Primary Examiner*—B. William Baumeister
*Assistant Examiner*—Matthew C Landau

(57) ABSTRACT

A GaN LED structure with a short period superlattice digital contacting layer is provided. The LED structure comprises, from the bottom to top, a substrate, a double buffer layer, an n-type GaN layer, a short period superlattice digital contacting layer, an active layer, a p-type shielding layer, and a contacting layer. The feature is to avoid the cracks or pin holes in the thick n-type GaN layer caused during the fabrication of heavily doped ($n>1\times10^{19}cm^{-3}$) thick n-type GaN contacting layer, so that the quality of the GaN contacting layer is assured. In addition, by using short period heavily doped silicon $Al_{1-x-y}Ga_xIn_yN$ ($n^{++}$-$Al_{1-x-y}Ga_xIn_yN$) to grow a superlattice structure to become a short period superlattice digital contacting layer structure, which is used as a low resistive n-type contacting layer in a GaInN/GaN MQW LED. In the following steps, it is easier to form an n-type ohmic contacting layer, and the overall electrical characteristics are improved. It also lowers the operating voltage of the entire element so that the energy consumption during operation is reduced and the yield rate is increased.

9 Claims, 4 Drawing Sheets

STRUCTURE OF GaN LIGHT-EMITTING DIODE

FIELD OF THE INVENTION

The present invention generally relates to a structure for GaN light emitting diodes (LED), and more specifically to an LED structure having a thick n-type GaN contacting layer made with low resistivity.

BACKGROUND OF THE INVENTION

Conventional multiquantum well (MQW) $In_{1-y}Ga_yN/GaN$ light emitting diodes (LED) use an n-type GaN grown at high temperature as an n-type contacting layer. However, during the making of low resistive thick n-type GaN contacting layer using the high density deposition ($n>1\times10^{19}$ $cm^{-3}$) silicon, it is found that the interior of the GaN layer is prone to crack or breakage due to the highly-deposited silicon. The result of this effect is that it does not only lower the quality of the GaN layer, but also increases the difficulty in the next step of fabricating an n-type ohmic contacting electrode layer on top of the GaN layer. Therefore, the LED is either dysfunctional, or has poor electrical characteristics, such as having higher operating voltage so that the energy consumption is increased, or has a low yield rate and the manufacturing cost increases. In addition, the high density deposition ($n>1\times10^{19}$ $cm^{-3}$) silicon on thick n-type GaN contacting layer can easily form pin holes, which will cause the electrical leakage in the component result in poor electrical characteristics of the diode. Therefore, it is imperative to provide a new structure to overcome the aforementioned problems.

SUMMARY OF THE INVENTION

The present invention has been made to overcome the aforementioned drawback of conventional GaN MQW LED structures. The primary object of the present invention is to provide a GaN LED structure having a short period super lattice contacting layer.

Another object of the present invention is to avoid the occurrence of crack or breakage in the thick n-type GaN layer caused by heavily deposited silicon during the fabrication of high density deposition ($n>1\times10^{19}$ $cm^{-3}$) thick n-type GaN contacting layer having a low resistivity, so that the quality of the heavily doped GaN contacting layer is assured. The superlattice structure grown by $n^{++}$-$Al_{1-x-y}Ga_xIn_yN$ which is heavily silicon doped is a short period superlattice contacting layer, and can be used as a contacting layer in the InGaN/GaN MQW LED structure.

The third object of the present invention is to provide a convenient step of growing an n-type ohmic contacting electrode layer to improve the overall electrical characteristics as to have a lower operating voltage and lower energy consumption, and to increase the yield rate.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
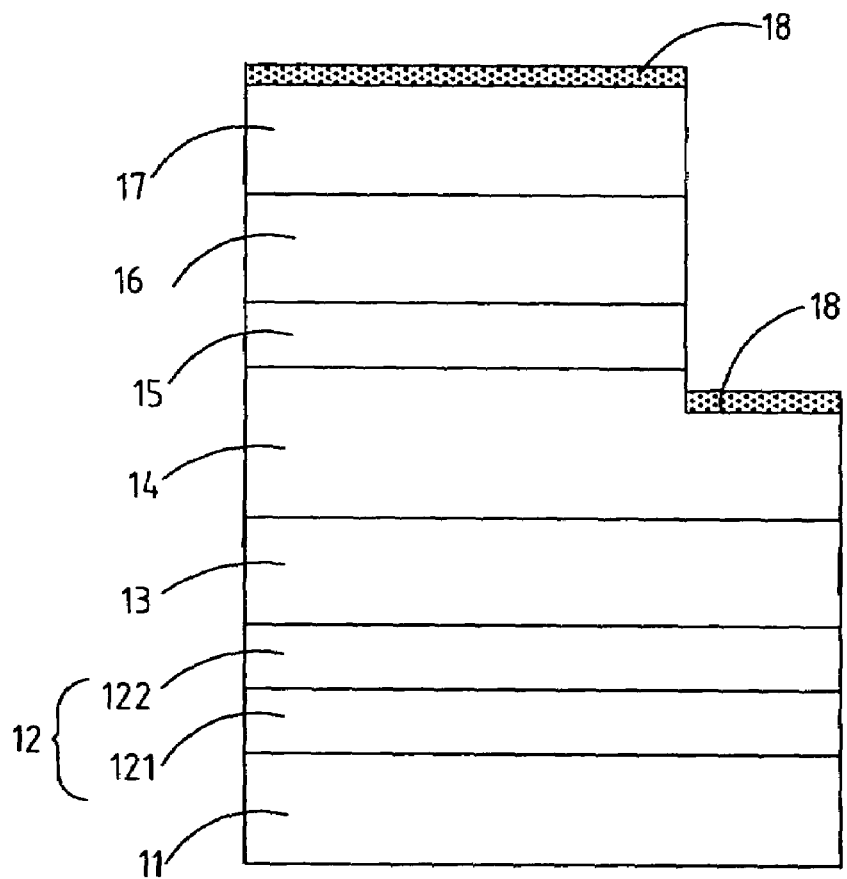
FIG. 1 shows a first embodiment of the present invention of a GaN LED structure.

FIG. 1 shows a first embodiment of the present invention of a GaN LED structure. The embodiment includes a substrate 11, a double buffer layer 12, an n-type GaN layer 13, a short period superlattice contacting layer 14, and active layer 15, and p-type shielding layer 16, and a contacting layer 17.

The substrate 11 is made of C-plane, R-plane, or A-plane aluminum-oxide monocrystalline (or sapphire), or an oxide monocrystalline having a lattice constant compatible with that of nitrides. The substrate 11 can also be made of SiC (6H-SiC or 4H-SiC), Si, ZnO, GaAs, or $MgAl_2O_4$. Generally, the most common material used for the substrate 11 is sapphire or SiC. Double buffer layer 12 is located on top of substrate 11, and includes a first buffer layer 121 and a second buffer layer 122. First buffer layer 121 is on top of substrate 11, and is made of $Al_{1-x-y}Ga_xIn_yN$, where $0\leq X<1$, $0\leq Y<1$ and $X+Y\leq 1$. Second buffer layer 122 is on top of first buffer layer 121, and is made of SiN. On top of double buffer layer 12 sits n-type GaN layer 13.

Figure 2:
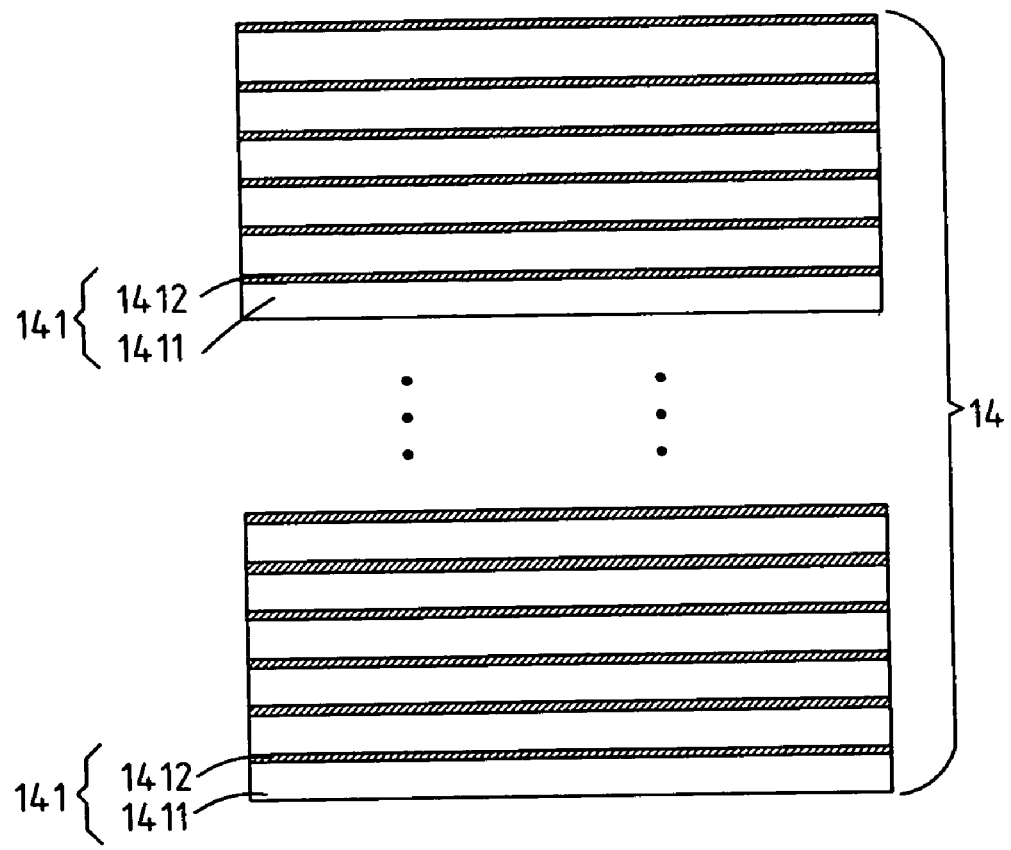
FIG. 2 shows a schematic view of the short period superlattice contacting layer of the first embodiment of the present invention of a GaN LED structure.

FIG. 2 shows a schematic view of the short period superlattice contacting layer of the first embodiment of the present invention of a GaN LED structure. Short period superlattice contacting layer 14, located on top of n-type GaN layer 13, includes a plurality of foundation layers 141, which is located on top of n-type GaN layer 13. Foundation layers 141 may be stacked, and at least five layers are included. Foundation layer 141 further includes a first base layer 1411 and a second base layer 1412. First base layer 1411 is made of heavily silicon doped n-type $Al_{1-x-y}Ga_xIn_yN$ ($n^{++}$-$Al_{1-x-y}Ga_xIn_yN$), and the density of the deposition is at least $n>1\times10^{19}$ $cm^{-3}$, where $0\leq X<1$, $0\leq Y<1$ and $X+Y\leq 1$. The thickness of first base layer 1411 is between 5 Å and 50 Å, and it is grown at temperature between 600° C. and 1200° C. Second base layer 1412 is made of SiN, and has a thickness between 2 Å and 10 Å, grown at temperature between 600° C. and 1200° C. Therefore, first base layer 1411 can be located on top of either n-type GaN layer 13, or second base layer 1412 due to the stack arrangement.

Act layer 15, located on top of short period superlattice contacting layer 14, is made of InGaN. Located on top of active layer 15 is p-type shielding layer 16, which is made of Mg-doped $Al_{1-x-y}Ga_xIn_yN$, where $0\leq X<1$, $0\leq Y<1$ and $X+Y<1$. Contacting layer 17, located on top of p-type shielding layer 16, is made of p-type Mg-doped $Al_{1-x-y}Ga_xIn_yN$, where $0\leq X<1$, $0\leq Y<1$ and $X+Y\leq 1$.

The first embodiment of the present invention of a GaN LED structure further includes an electrode layer 18, located on top of contacting layer 17 or short period superlattice contacting layer 14. Electrode layer 18 forms a good ohmic contacting layer. Electrode layer 18 may be made of the following materials: Ti/Al, Cr/Au, Cr/Al, Cr/Pt/Au, Ti/Pt/Au, Cr/Pd/Au, Ti/Pd/Au, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/

Au, Cr/Al/Pt/Au, Cr/Al/Pd/Au, Cr/A/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/Au, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au, TiWNx/Ti/Au, TiWNx/Pt/Au, TiWNx/Ni/Au, TiWNx/Pd/Au, TiWNx/Cr/Au, TiWNx/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, Ti/NiAl/Cr/Au, or any of their compounds.

Figure 3:
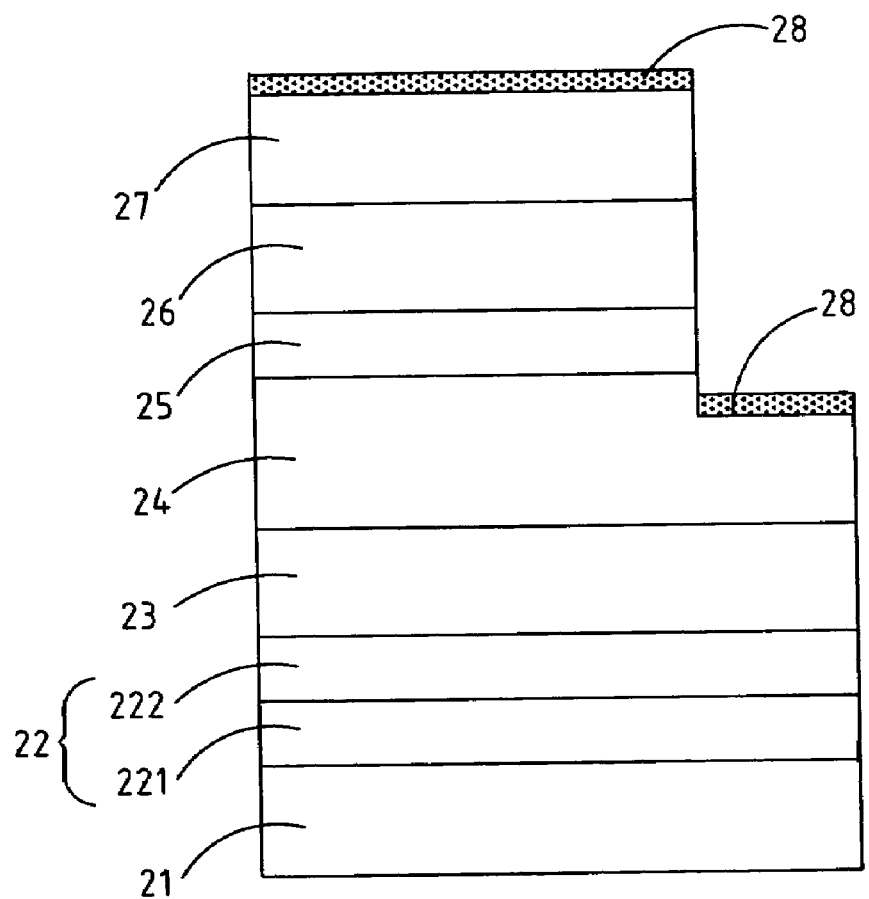
FIG. 3 shows a second embodiment of the present invention of a GaN LED structure.

FIG. 3 shows a second embodiment of the present invention of a GaN LED structure. The embodiment includes a substrate 21, a double buffer layer 22, an n-type GaN layer 23, a short period superlattice contacting layer 24, and active layer 25, and p-type shielding layer 26, and a contacting layer 27.

The substrate 21 is made of C-plane, R-plane, or A-plane aluminum-oxide monocrystalline (or sapphire), or an oxide monocrystalline having a lattice constant compatible with that of nitrides. The substrate 21 can also be made of SiC (6H-SiC or 4H-SiC), Si, ZnO, GaAs, or $MgAl_2O_4$. Generally, the most common material used for the substrate 21 is sapphire or SiC. Double buffer layer 22 is located on top of substrate 21, and includes a first buffer layer 221 and a second buffer layer 222. First buffer layer 221 is on top of substrate 21, and is made of $Al_{1-x-y}Ga_xIn_yN$, where $0 \leq X<1$, $0 \leq Y<1$ and $X+Y \leq 1$. Second buffer layer 222 is on top of first buffer layer 221, and is made of SiN. On top of double buffer layer 22 sits n-type GaN layer 23.

Figure 4:
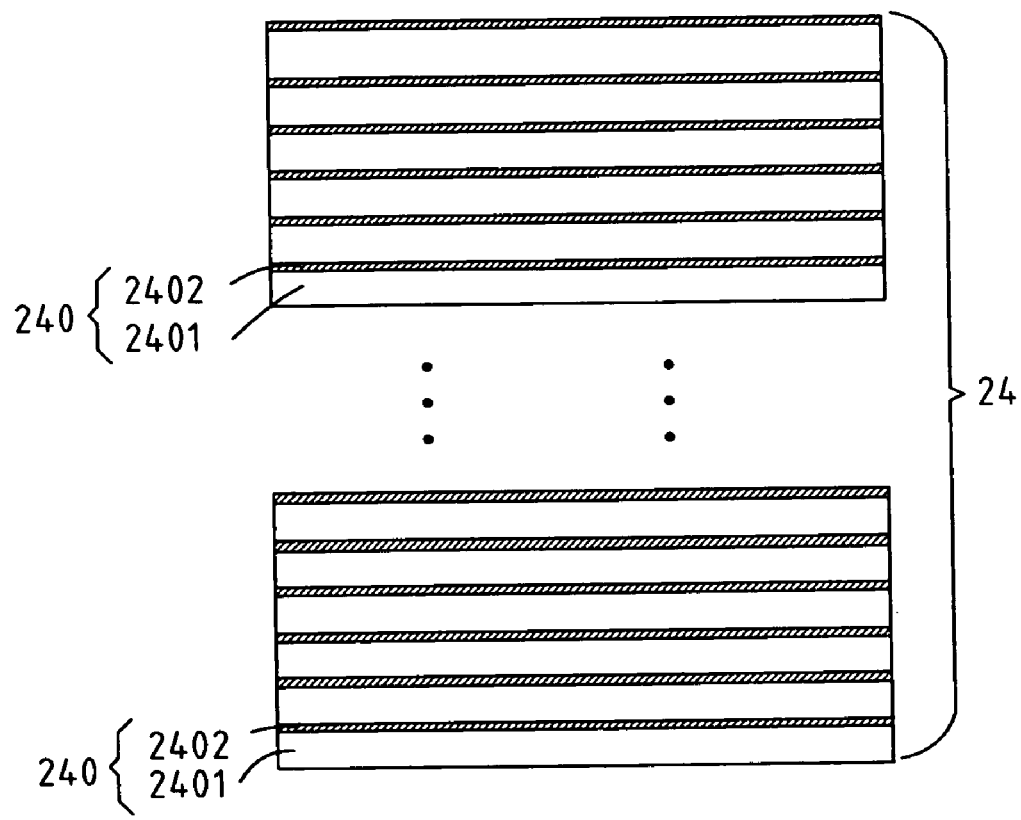
FIG. 4 shows a schematic view of the short period superlattice digital contacting layer of the second embodiment of the present invention of a GaN LED structure.

FIG. 4 shows a schematic view of the short period superlattice contacting layer of the first embodiment of the present invention of a GaN LED structure. Short period superlattice contacting layer 24, located on top of n-type GaN layer 23, includes a plurality of foundation layers 240, which is located on top of n-type GaN layer 23. Foundation layers 240 may be stacked, and at least five layers are included. Foundation layer 240 further includes a first base layer 2401 and a second base layer 2402. First base layer 2401 is made of heavily silicon doped n-type $Al_{1-x-y}Ga_xIn_yN$ ($n^{++}$-$Al_{1-x-y}Ga_xIn_yN$) and the density of the deposition is at least $n>1\times10^{19} cm^{-3}$, where $0 \leq X<1$, $0 \leq Y<1$ and $X+Y \leq 1$. The thickness of first base layer 2401 is between 5 Å and 50 Å, and it is grown at temperature between 600° C. and 1200° C. Second base layer 2402 is made of undoped $In_uGa_uN$, where $0 \leq u<1$, and has a thickness between 5 Å and 50 Å, grown at temperature between 600° C. and 1200° C. Therefore, first base layer 2401 can be located on top of either n-type GaN layer 23, or second base layer 2402 due to the stack arrangement.

Act layer 25, located on top of short period superlattice contacting layer 24, is made of InGaN. Located on top of active layer 25 is p-type shielding layer 26, which is made of Mg-doped $Al_{1-x-y}Ga_xIn_yN$, where $0 \leq X<1$, $0 \leq Y<1$ and $X+Y \leq 1$. Contacting layer 27, located on top of p-type shielding layer 26, is made of p-type Mg-doped $Al_{1-x-y}Ga_xIn_yN$, where $0 \leq X<1$, $0 \leq Y<1$ and $X+Y \leq 1$.

The second embodiment of the present invention of a GaN LED structure further includes an electrode layer 28, located on top of contacting layer 27 or short period superlattice contacting layer 24. Electrode layer 28 forms a good ohmic contacting layer. Electrode layer 28 may be made of the following materials: Ti/Al, Cr/Au, Cr/Al, Cr/Pt/Au, Ti/Pt/Au, Cr/Pd/Au, Ti/Pd/Au, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/Au, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au, TiWNx/Ti/Au, TiWNx/Pt/Au, TiWNx/Ni/Au, TiWNx/Pd/Au, TiWNx/Cr/Au, TiWNx/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, Ti/NiAl/Cr/Au, or any of their compounds.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN LED structure, comprising:
   a substrate made of a material selected from the group consisting of sapphire, 6H—SiC, 4H—SiC, Si, ZnO, GaAs, $MgAl_2O_4$, and an oxide monocrystalline having a lattice constant compatible with that of nitrides;
   a double buffer layer, located on top of said substrate, further comprising:
   a first buffer layer, made of $Al_{1-x-y}Ga_xIn_yN$, $0 \leq X<1$, $0 \leq Y<1$, and $X+Y \leq 1$, located on top of said substrate, and
   a second buffer layer, made of SiN, located on top of said first buffer layer;
   an n-type GaN layer, located on top of said double buffer layer;
   a short period superlattice contacting layer, located on top of said n-type GaN layer, further comprising:
   a plurality of foundation layers, located on top of said n-type GaN layer, each of said foundation layers further comprising:
   a first base layer, made of heavily silicon doped silicon n-type $Al_{1-x-y}Ga_xIn_yN(n^{++}$—$Al_{1-x-y}Ga_xIn_yN)$, where $0 \leq X<1$, $0 \leq Y<1$, and $X+Y \leq 1$, and
   a second base layer, located on top of said first base layer, made of SiN;
   an active layer, made of InGaN, located on top of said short period superlattice digital contacting layer;
   a p-type shielding layer, made of Mg-doped $Al_{1-x-y}Ga_xIn_yN$ where $0 \leq X<1$, $0 \leq Y<1$, and $X+Y \leq 1$, located on top of said active layer;
   a contacting layer, made of p-type Mg-doped $Al_{1-x-y}Ga_xIn_yN$ where $0 \leq X<1$, $0 \leq Y<1$, and $X+Y \leq 1$, located on top of said p-type shielding layer.

2. The LED structure as claimed in claim 1, wherein said first base layer is located on top of either said n-type GaN layer or said second base layer.

3. The LED structure as claimed in claim 1, wherein said first base layer has a thickness ranging from 5 Å to 50 Å.

4. The LED structure as claimed in claim 1, wherein said first base layer is grown at temperature between 600° C. and 1200° C.

5. The LED structure as claimed in claim 1, wherein said first base layer has a heavily doped density no less than $10^{19}$ per cubic centimeters (i.e., $n>1\times10^{19} cm^{-3}$).

6. The LED structure as claimed in claim 1, wherein said second base layer has a thickness ranging from 2 Å to 10 Å.

7. The LED structure as claimed in claim 1, wherein said second base layer is grown at temperature between 600° C. and 1200° C.

8. The LED structure as claims in claim 1, wherein the number of said foundation layers is at least five.

9. The LED structure as claimed in claim 1, further comprising an electrode layer, located on top of said contacting layer or said short period superlattice digital contacting layer, said electrode layer forming a good ohmic contacting layer and made of a material selected from a group consisting of Ti/Al, Cr/Au, Cr/Al, Cr/Pt/Au, Ti/Pt/Au, Cr/Pd/Au, Ti/Pd/Au, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/Au, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au, TiWNx/Ti/Au, TiWNx/Pt/Au, TiWNx/Ni/Au, TiWNx/Pd/Au, TiWNx/Cr/Au, TiWNx/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Cr/Au, and compounds thereof.

* * * * *